United States Patent
Kikkawa

(10) Patent No.: US 8,030,638 B2
(45) Date of Patent: Oct. 4, 2011

(54) QUASI SINGLE CRYSTAL NITRIDE SEMICONDUCTOR LAYER GROWN OVER POLYCRYSTALLINE SIC SUBSTRATE

(75) Inventor: Toshihide Kikkawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 90 days.

(21) Appl. No.: 12/240,272

(22) Filed: Sep. 29, 2008

(65) Prior Publication Data
US 2009/0026466 A1    Jan. 29, 2009

Related U.S. Application Data

(63) Continuation of application No. PCT/JP2006/306508, filed on Mar. 29, 2006.

(51) Int. Cl.
*H01L 29/06* (2006.01)
*H01L 29/12* (2006.01)

(52) U.S. Cl. ........ 257/11; 257/13; 257/77; 257/E25.019; 257/E21.527; 438/22; 438/48

(58) Field of Classification Search ........... 257/11, 257/13, 73, 76–78, 183, 200–201, E25.019, 257/E25.028, E21.527; 438/22, 48, 570, 438/572, 931
See application file for complete search history.

(56) References Cited

U.S. PATENT DOCUMENTS

| | | | |
|---|---|---|---|
| 6,377,596 B1 | 4/2002 | Tanaka et al. | |
| 6,606,335 B1 | 8/2003 | Kuramata et al. | |
| 6,693,021 B1 | 2/2004 | Motoki et al. | |
| 2001/0038655 A1 | 11/2001 | Tanaka et al. | |
| 2002/0127856 A1 | 9/2002 | Kunisato et al. | |
| 2002/0175340 A1 | 11/2002 | Shibata et al. | |
| 2004/0072410 A1 | 4/2004 | Motoki et al. | |
| 2004/0089222 A1 | 5/2004 | Motoki et al. | |
| 2005/0022725 A1 | 2/2005 | Jurgensen et al. | |
| 2005/0087766 A1 | 4/2005 | Kikkawa | |
| 2005/0257733 A1 | 11/2005 | Nakahata | |
| 2006/0284247 A1* | 12/2006 | Augustine et al. | ............ 257/338 |

FOREIGN PATENT DOCUMENTS

| | | |
|---|---|---|
| JP | 2002-053398 A | 2/2002 |
| JP | 2002-261392 A | 9/2002 |

(Continued)

OTHER PUBLICATIONS

International Search Report of PCT/JP2006/306508, date of mailing Jun. 27, 2006.

*Primary Examiner* — Hoai V Pham
(74) *Attorney, Agent, or Firm* — Fujitsu Patent Center

(57) ABSTRACT

A compound semiconductor device is manufactured by using a polycrystalline SiC substrate, the compound semiconductor device having a buffer layer being formed on the substrate and having a high thermal conductivity of SiC and aligned orientations of crystal axes. The method for manufacturing the compound semiconductor device includes: forming a mask pattern on a polycrystalline SiC substrate, the mask pattern having an opening of a stripe shape defined by opposing parallel sides or a hexagonal shape having an apex angle of 120 degrees and exposing the surface of the polycrystalline SiC substrate in the opening; growing a nitride semiconductor buffer layer, starting growing on the polycrystalline SiC substrate exposed in the opening of the mask pattern, burying the mask pattern, and having a flat surface; and growing a GaN series compound semiconductor layer on the nitride semiconductor buffer layer.

24 Claims, 10 Drawing Sheets

FOREIGN PATENT DOCUMENTS

| | | |
|---|---|---|
| JP | 2002-284600 A | 10/2002 |
| JP | 2003-309331 A | 10/2003 |
| JP | 2005-136001 A | 5/2005 |
| JP | 2005-513799 A | 5/2005 |
| WO | 97/11518 A1 | 3/1997 |
| WO | 99/23693 A1 | 5/1999 |
| WO | 00/04615 A1 | 1/2000 |
| WO | 20041112112 A1 | 12/2004 |

* cited by examiner

US 8,030,638 B2

QUASI SINGLE CRYSTAL NITRIDE SEMICONDUCTOR LAYER GROWN OVER POLYCRYSTALLINE SIC SUBSTRATE

CROSS REFERENCE TO RELATED APPLICATION

This application is based on PCT/JP2006/306508, filed on Mar. 29, 2006, the entire contents of which are incorporated herein by reference.

FIELD OF THE ART

The present invention relates to a compound semiconductor wafer, a compound semiconductor device, and their manufacture method.

BACKGROUND

Compound semiconductor devices using GaN or GaN series compound semiconductor are under active development. GaN has a wide band gap of 3.4 eV allowing a high voltage operation. Various types of semiconductor devices can be manufactured by forming a hetero junction of GaN series compound semiconductor. Metal organic chemical vapor deposition (MOCVD) is mainly used as a crystal growth method.

A semiconductor light emitting device using GaN series compound semiconductor can emit blue or ultraviolet light, and can form a white light source by using phosphors. Various light emitting devices are manufactured by growing GaN series compound semiconductor crystal on a sapphire substrate or an SiC substrate.

GaN has a high breakdown voltage, and is expected for applications in a field requiring a high voltage operation and a high speed operation such as high electron mobility transistors (HEMT) used in a mobile phone base station. Various types of GaN-HEMT have been reported having a GaN layer as an electron transfer layer in GaN/AlGaN crystal layers grown on a substrate such as sapphire, SiC, GaN and Si. A breakdown voltage value over 300 V in current-off state is presently reported. The best output characteristics are now obtained in GaN-HEMT using an SiC substrate. High thermal conductivity of SiC contributes to this performance. In manufacturing a high speed operation GaN device, a semi-insulating SiC substrate is used to suppress a parasitic capacitance.

International Publication WO00/04615 proposes to manufacture a semiconductor laser by forming AlGaN patterns having a (1-100) direction stripe shape on (0001) Si plane of an SiC substrate and growing GaN on the AlGaN patterns by MOCVD. The grown GaN layers gradually fill the gap between the AlGaN patterns.

JP-A-2003-309331 proposes to manufacture a semiconductor optical device or a semiconductor electronic device by forming a mask layer of amorphous insulator on a (0001) sapphire substrate, opening a square window through the mask layer to expose a part of the substrate and growing nitride semiconductor on the substrate.

JP-A-2002-53398 reports that single crystal GaN having a (0001) plane of hexagonal crystal structure with flat mirror surfaces was obtained by cleaning a 3C polycrystalline silicon carbide substrate oriented in a [111] axis direction at 1100° C., thereafter lowering a substrate temperature to 650° C. and growing GaN on the silicon carbide substrate by MOCVD using ammonium and trimethyl gallium as sources. This publication reports also that a silicon oxide film is laminated on a silicon carbide substrate, a circular window is formed through the silicon oxide film, and a GaN layer is grown thereon and that liquid phase epitaxy (LPE) is used in place of vapor phase deposition.

FIG. 10A is a schematic cross sectional view showing the structure of a GaN-HEMT device made in public by the present inventor. After an AlN buffer layer 103 is grown on a (0001) single crystal SiC substrate 101 by MOCVD, a non-doped GaN active layer 104, a non-doped AlGaN spacer layer 105 and an Si doped n-type AlGaN electron supply layer 106 are grown on the AlN buffer layer to form a GaN-HEMT structure, and then an n-type GaN protective layer 7 is grown. Formed on the n-type GaN protective layer 107 are a Schottky contact gate electrode G, an ohmic contact source electrode S and an ohmic contact drain electrode D. An exposed surface of the n-type GaN protective layer 107 is covered with an SiN film 108. Although GaN is hard to grow on the SiC surface, GaN can be grown more easily by forming the AlN buffer layer. A current collapse phenomenon that an on-resistance changes during operation can be avoided by forming the GaN protective layer and SiN layer on and above the n-type AlGaN electron supply layer. SiC has a high thermal conductivity and can realize a high speed operation at a high operation voltage. A price of a semi-insulating single crystal SiC substrate is high, leading a possibility of hindering to prevail GaN devices.

FIG. 10B is a cross sectional view of a SiC composite substrate. The composite substrate is formed by bonding a polycrystalline SiC substrate and an Si substrate. By using the polycrystalline SiC substrate, the cost is reduced and a high thermal conductivity of SiC is provided. By bonding the single crystal Si substrate, the single crystal characteristics can be retained. This SiC composite substrate is available from Soitech SA, France. An epitaxial layer is formed on the single crystal Si substrate. Si has a lower thermal conductivity than that of SiC so that the merit of a high thermal conductivity of SiC is difficult to be utilized fully. Since Si and SiC have different thermal expansion coefficients, a stress is generated.

SUMMARY

According to one aspect of the present invention, there is provided a semiconductor device comprising:

a polycrystalline SiC substrate;

a mask pattern formed on the polycrystalline SiC substrate, the mask pattern having an opening of a stripe shape defined by opposing parallel sides or a polygonal shape using at least part of six sides of a hexagon and exposing a surface of the polycrystal line SiC substrate in the opening;

a nitride semiconductor buffer layer contacting the polycrystalline SiC substrate in the opening of the mask pattern, burying the mask pattern, and having a flat surface; and a GaN series compound semiconductor layer formed on the nitride semiconductor buffer layer.

According to another aspect of the present invention, there is provided a method for manufacturing a semiconductor device, comprising:

(a) forming a mask pattern on a polycrystalline SiC substrate, the mask pattern having an opening of a stripe shape defined by opposing parallel sides or a polygonal shape using at least part of six sides of a hexagon and exposing a surface of the polycrystalline SiC substrate in the opening;

(b) growing a nitride semiconductor buffer layer starting growing on the polycrystalline SiC substrate exposed in the opening of the mask pattern, burying the mask pattern, and having a flat surface; and (c) growing a GaN series compound semiconductor layer on the nitride semiconductor buffer layer.

DESCRIPTION OF THE EMBODIMENTS

Figure 2A:
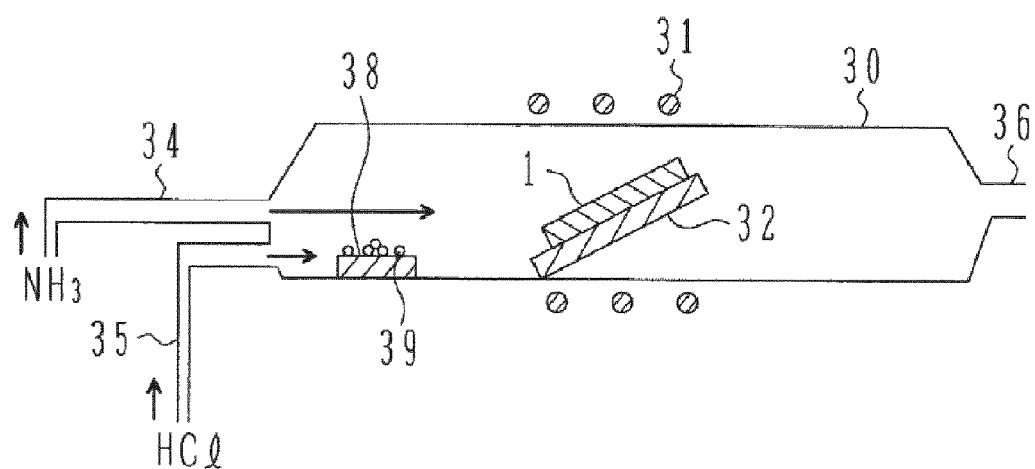
FIGS. 2A and 2B are schematic cross sectional views of a hydride VPE system and an MOCVD system.
Figure 2B:
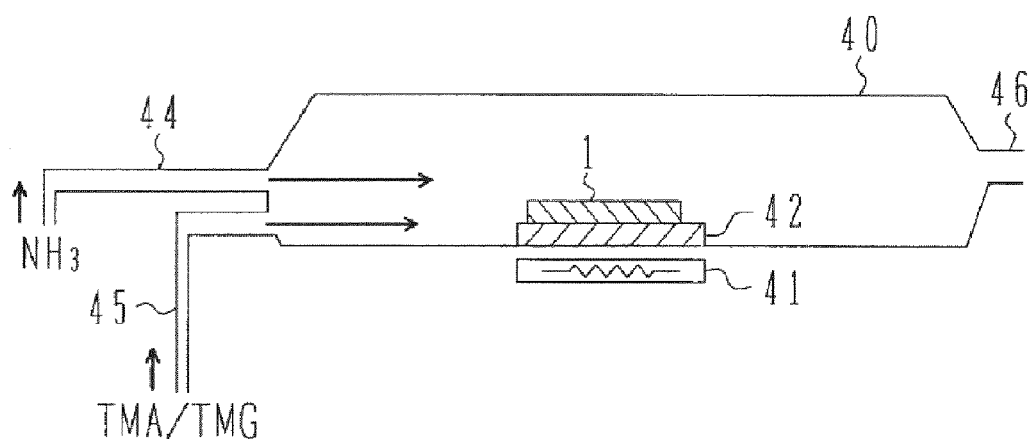

A metal organic chemical vapor deposition (MOCVD) method and a hydride vapor phase epitaxy (VPE) method are known as representative crystal growth methods for growing crystal of GaN series compound semiconductor. The term "gallium nitride (GaN) series compound semiconductor" is used to mean $Al_xIn_yGa_{1-x-y}N$ ($0 \leq x \leq 1.0$, $0 \leq y \leq 1.0$). FIGS. 2A and 2B schematically show the structures of a hydride VPE system and an MOCVD system.

FIG. 2B is a schematic cross sectional view showing the structure of an MOCVD system. A carbon heater 41 is disposed outside a quartz reaction tube 40 to heat the inside of the reaction tube. A carbon susceptor 42 for placing a substrate 1 thereon is disposed inside the reaction tube 40 at a position facing the carbon heater 41. Two gas introducing pipes 44 and 45 are connected to the reaction tube 40 at its upstream side to supply compound semiconductor source gases. For example, $NH_3$ as N source gas is introduced from the gas introducing pipe 44, and group III compound source material such as trimethyl-aluminum or trimethyl-gallium as group III element source gas is introduced from the introducing pipe 45. Crystal growth occurs on a substrate 1, and remaining gas is exhausted from a gas exhaust tube 46 to a harmful gas removal tower. If MOCVD is performed in a low pressure atmosphere, the gas exhaust tube 46 is connected to a vacuum pump and an exhaust port of the vacuum pump is connected to the harmful gas removal tower.

MOCVD has been used widely as a compound semiconductor crystal growth method, and can provide good crystallinity. Various techniques for impurity doping and thickness control have been established. A growth speed is 1 μm/h at the highest.

FIG. 2A is a schematic cross sectional view showing the structure of a hydride VPE system. An induction heating coil 31 is wound around the circumference of a quartz reaction tube 30, and a carbon susceptor 32 for placing a substrate 1 thereon is disposed inside the reaction tube. Two gas introducing pipes 34 and 35 are coupled to the reaction tube 30 at its upstream end shown at the left in FIG. 2A. A gas exhaust pipe 36 is connected at the downstream end of the reaction tube 30. A boat 38 is disposed at the upstream side of the susceptor 32 in the reaction tube 30, and accommodates therein source material 39 of a group III element of the compound to be grown. For example, the source 39 is Al for growing AlN and Ga for growing GaN. Ammonium $NH_3$ as N source gas is introduced from the gas introducing pipe 34, and HCl is introduced from the gas introducing pipe 35. HCl reacts with the group III source 39 in the boat 38 to form group III element chloride AlCl. The source gases AlCl and $NH_3$ are transported to the substrate 1 and react on the substrate surface to grow AlN. Remaining gas is exhausted via the gas exhaust pipe 36 to a harmful gas removal tower.

Hydride VPE utilizes chloride as a group III element source. A growth speed is as very high as several tens μm/h. A grown crystal layer has a high possibility of containing chlorine (Cl) derived from the source gas. A growth speed of MOCVD is too low, and hydride VPE capable of providing a high growth speed is suitable for forming an inexpensive template substrate.

Although a semi-insulating single crystal SiC substrate is very expensive, an inexpensive polycrystalline SiC substrate having an orientation along the [0001] direction is available. The present inventor has tried an approach of forming a GaN series compound semiconductor device by using an inexpensive polycrystalline SiC substrate. When an AlN buffer layer, a GaN layer and an AlGaN layer are grown directly on a polycrystalline SiC substrate to form GaN-HEMT, a surface roughness becomes large, and although crystalline orientation is aligned along the c-axis to some degree, crystalline orientation is not aligned along the a-axis so that a number of crystalline grain boundaries are formed. In order to overcome this, the present inventor has tried to utilize a crystal growth habit that hexagonal crystal has a strong tendency of growing crystal in a hexagonal pillar shape.

Figure 1A:
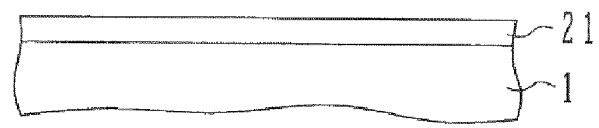
FIG. 1A to FIG. 1G are cross sectional views and plan views to be used for explaining the experiments made by the present inventor.

As shown in FIG. 1A, an AlN layer 21 was grown to about 300 nm by hydride VPE on an SiC polycrystalline substrate 1 having the [0001] orientation. The hydride VPE system used has the structure shown in FIG. 2A, and group III element source material in the boat 38 is Al. The conditions of hydride VPE are as follows:

Pressure: normal pressure

Gas flow rate: HCl: 100 ccm, $NH_3$: 10 LM (litter per minute)

Temperature: 1100° C.

Figure 1B:
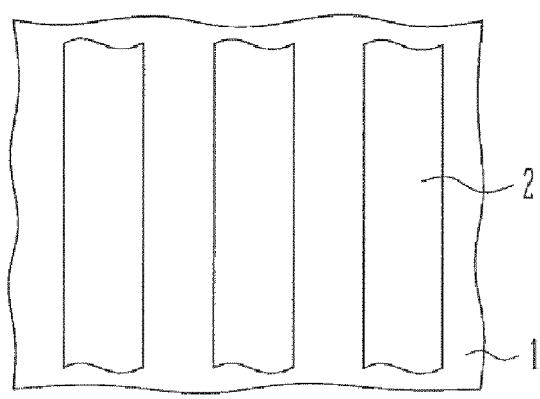

As shown in FIG. 1B, the AlN layer 21 was patterned by dry etching using $Cl_2$ gas as etchant and a resist mask to form stripe-shaped mask patterns 2. The etching was performed by reactive ion etching at a $Cl_2$ gas flow rate of 10 sccm. The resist mask was removed thereafter. The stripes of the mask pattern have a width of about 1 to 2 μm and a gap distance of about 1 to 2 μm. Namely, an opening of the mask pattern has a stripe-shape defined by parallel sides facing at a distance of about 1 to 2 μm.

Figure 1C:
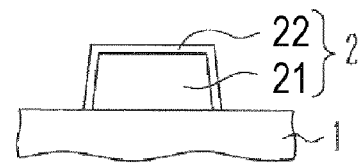

As shown in FIG. 1C, while the AlN layer 21 is patterned, the surface of the AlN layer 21 is oxidized and hence is covered with an oxide film 22. Namely, the mask pattern 2 is constituted of the AlN layer 21 and surface oxide film 22.

Figure 1D:
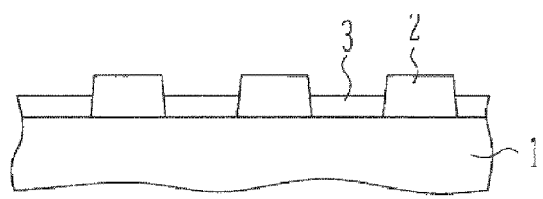

As shown in FIG. 1D, an AlN layer 3 is grown on the polycrystalline SiC substrate 1 having the mask pattern 2, by hydride VPE. The conditions of hydride VPE are the same as the conditions described above. AlN has a property that it grows on the surface of the SiC substrate 1 with priority over other surfaces and does not grow on the surface oxide film 22 of the mask pattern 2. An initial growth occurs preferentially on the surface of the SiC substrate defined by the mask pattern 2, so that an AlN layer 3 grows whose outer periphery is defined by the mask pattern 2.

Figure 1E:
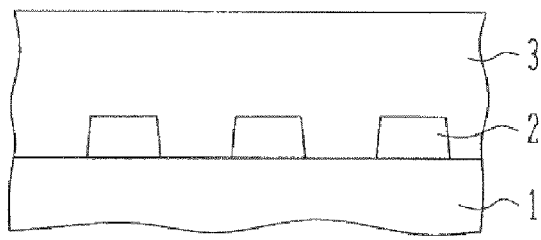

As shown in FIG. 1E, as the growth surface reaches the upper surface of the mask pattern 2, the AlN layer grows also on the upper surface of the mask pattern 2 by lateral growth. After the whole upper surface of the mask pattern 2 is covered with the AlN layer 3, the AlN layer is grown to a thickness at least equal to a predetermined thickness so that the grown surface is planarized.

Figure 1F:
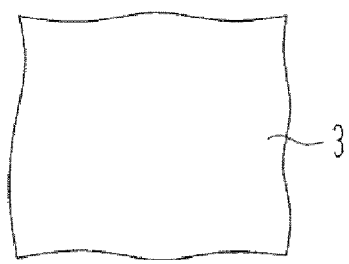

FIG. 1F is a sketch of a SEM photograph showing the surface of the AlN layer 3 grown to a thickness of 5 to 50 μm. A flat surface is obtained. Even if the crystal is not a perfect single crystal, it may be possible to regard the grown crystal as quasi single crystal made of an assembly of grains having aligned axis directions.

Figure 1G:
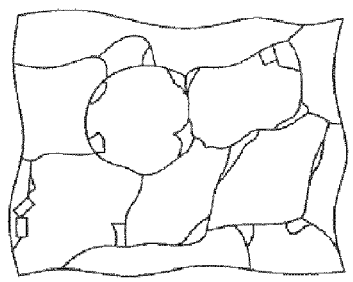

FIG. 1G is a sketch of a SEM photograph showing a growth surface of a comparative example of an AlN layer grown without the mask pattern 2. Grain boundaries can be clearly observed and the surface is not flat.

Figure 3A:
FIGS. 3A and 3B show SEM images corresponding to FIGS. 1F and 1G.
Figure 3B:
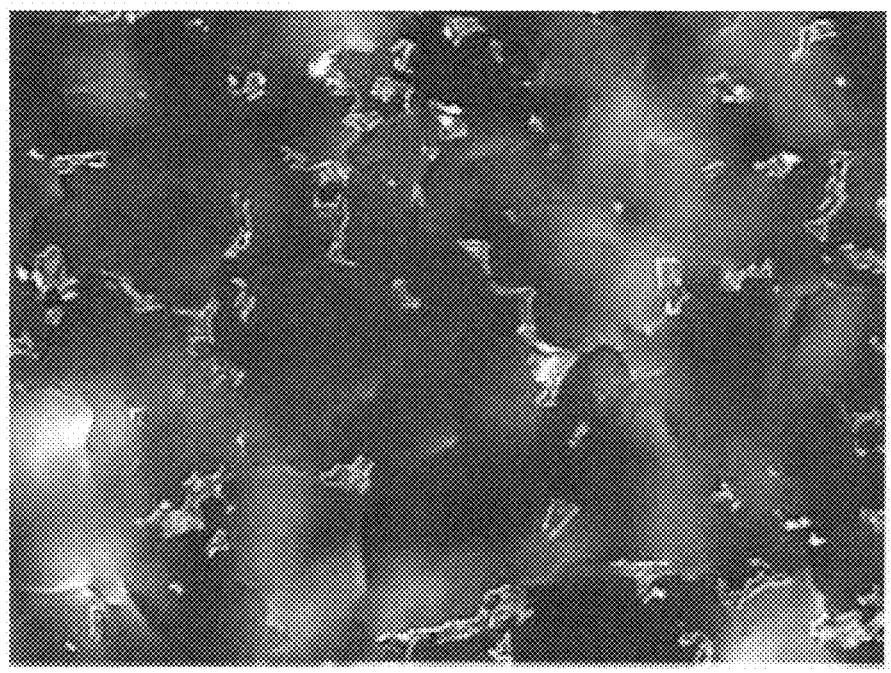

FIG. 3A shows a SEM image corresponding to FIG. 1F, and FIG. 3B shows a SEM image of the comparative example corresponding to FIG. 1G. In the comparative example, projections considered to be formed along the grain boundaries are observed clearly and it can be seen that although the c-axes are aligned, the a-axes are not aligned. It has been found that the AlN layer grown on the substrate provided with the mask pattern having stripe-shaped openings defined by opposing parallel sides, can form a single-crystal-like region with not only aligned c-axes but also aligned a-axes. This single-crystal-like region is called quasi single crystal.

Quasi single crystal can be grown by growing an AlN layer on a polycrystalline SiC substrate having a mask pattern with stripe-shaped openings. The present inventor considers the reason for this in the following manner.

Figure 4A:
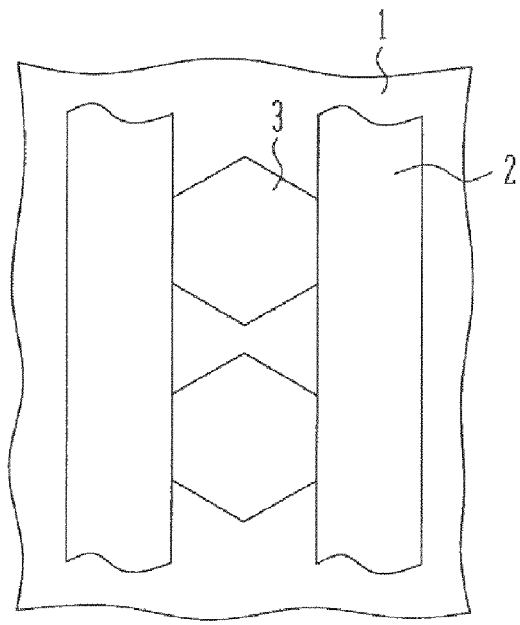
FIGS. 4A, 4B and 4C are a plan view illustrating a function of a mask pattern and plan views showing other examples of the shape of a mask pattern.

As shown in FIG. 4A, the mask patterns 2 are disposed in parallel, and have parallel sides. Therefore, an SiC substrate surface exposed between the mask patterns 2 is sandwiched between two parallel walls. That is, the free space on the SiC substrate is defined by parallel side walls. Consider now that the growth process forms an AlN growth nucleus on the SiC substrate surface, grows a hexagonal pillar thereon, and that one side of the hexagonal pillar contacts the parallel wall. If one side of the hexagonal pillar of hexagonal crystal has the same orientation as that of the parallel wall, it is expected that crystal growth becomes stable, continues and expands. If one side of the hexagonal pillar has an orientation crossing the parallel wall, the crystal growth may be hindered. Estimating from the results shown in FIGS. 1F, 1G, 3A and 3B, crystal whose one side of the hexagonal pillar is parallel to the parallel wall grows preferentially. These crystals have a common a-axis, as well as a common c-axis. When these crystals contact each other, they will be merged to grow a larger crystal grain, since the c- and a-axes of these crystals are aligned.

It is difficult to form the mask pattern at a precision of an atomic order. It is possibly inevitable that there is a shift of orientations of grown crystal grains. From the fact that the flat surface is obtained, however, it can be estimated that a shift of orientations of grown crystal grains is not fatal, and a total growth occurs while the shift is incorporated therein. It is considered that quasi single crystal can thus be formed.

As described above, it is considered that an AlN layer having aligned a-axis directions grows while the crystal wall of AlN is guided by the side wall of the mask pattern 2. In utilizing the hexagonal crystal wall of AlN, not only the parallel stripe-shaped mask pattern, but other shapes are also expected to be applied.

Figure 4B:
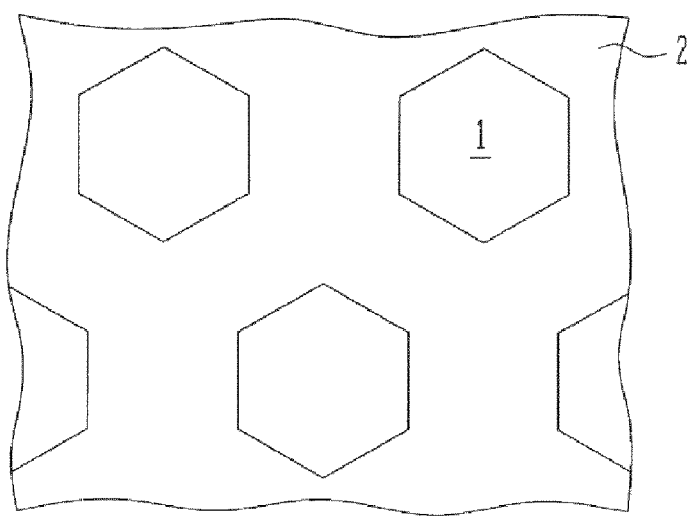

FIG. 4B shows a mask pattern having regular hexagonal openings. This mask pattern 2 has regular hexagonal openings and exposes the surface of the SiC substrate 1 in the openings. It is expected that as SiC grows in-plane with its hexagonal pillar wall being aligned with one mask side wall, other side walls of the SiC hexagonal pillar become parallel to other mask side walls, and when the pillar wall contacts the side wall, this contact becomes plane contact. A hexagonal opening is not limited to a regular hexagonal opening.

Figure 4C:
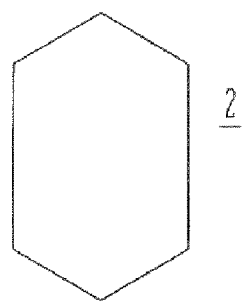

FIG. 4C shows a hexagonal shape which has an apex angle of 120 degrees and a length of a pair of opposing sides is longer than the other sides. It is expected that there is a possibility that AlN crystal with aligned a-axis directions can be grown by using any hexagonal shape if only the apex angle is retained at 120 degrees.

Instead of the hexagonal shapes shown in FIGS. 4B and 4C, it is expected that a polygonal shape formed by omitting some sides of the hexagonal shape and extending adjacent sides is also applicable. Namely, a polygonal shape using at least some of the sides of a hexagonal shape is considered to be used for the mask opening.

Figure 5:
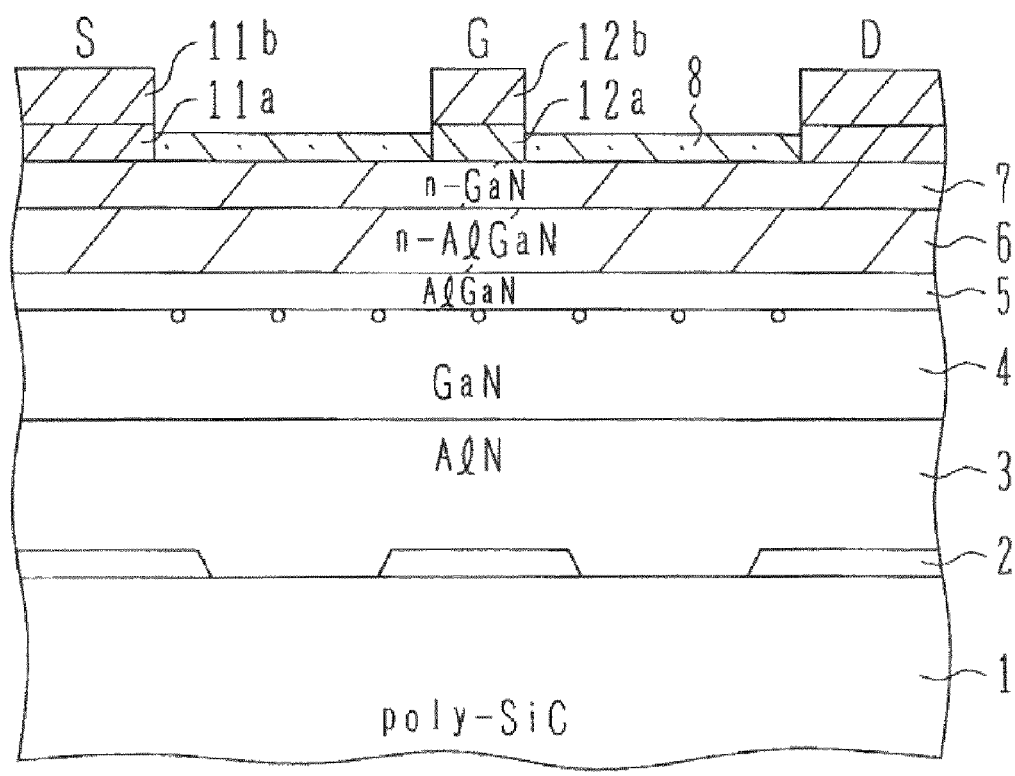
FIG. 5 is a schematic cross sectional view of a GaN-HEMT according to a first embodiment.

FIG. 5 is a schematic cross sectional view showing the structure of GaN-HEMT according the first embodiment utilizing the above-described experiment results. An SiC substrate is a polycrystalline SiC substrate whose crystal orientation is set along the [0001] (c-axis) direction. Similar to the experiments described with reference to FIGS. 1A to 1G, an AlN layer is grown on the polycrystalline SiC substrate 1 to a thickness of 300 nm, and patterned by using a resist pattern to form a parallel stripe-shaped AlN mask pattern 2 having a width of 1 to 2 μm and a distance of 1 to 2 μm.

An AlN layer 3 is grown on the SiC substrate 1 having the mask pattern 2 to a thickness of 5 to 50 μm, e.g., 5 μm by hydride VPE. The AlN layer 3 grows by burying the AlN mask pattern 2. A quasi single crystal AlN layer 3 having a high resistance and not only aligned c-axes along a plane normal direction but also aligned a-axis directions. Although a resistivity of the polycrystalline SiC substrate 1 is about $1 \times 10^3$ to $1 \times 10^5 \Omega$, a resistivity of the AlN buffer layer 3 can be set extremely higher than that of the substrate. It is therefore effective for reducing a parasitic capacitance.

HEMT constituting layers are grown on the AlN buffer layer 3 by metal organic chemical vapor deposition (MOCVD). Although MOCVD is difficult to obtain a high growth speed, it provides excellent thickness controllability, hetero junction formation and the like.

The MOCVD conditions using the MOCVD system shown in FIG. 2B are set, for example, as in the following:

Source material and its flow rate:
Trimetyl gallium (TMG): 50 sccm (standard cubic centimeter per minute
Trimetyl aluminum (TMA)): if necessary, 20 SLM (standard liter per minute)
n-type impurities: silane ($SiH_4$)
p-type impurities: bis-cyclopentadienyl magnesium (Cp2Mg)
Pressure: 100 torr
Temperature: 1050° C.

TMG and $NH_3$ are supplied (TMA not supplied), a GaN layer 4 having a thickness of e.g., 3 μm is grown on the AlN buffer layer 3 by MOCVD. This GaN layer 4 is non-doped, and is used as an active layer in which two-dimensional electron gas (2DEG) transits.

Continuously with the growth of the GaN layer 4, TMA as Al source gas starts being supplied to grow a non-doped AlGaN layer 5 having a thickness of, e.g., 5 nm, and then by introducing also silane $SiH_4$ as source gas for n-type impurities, an n-type GaN layer 6 is grown to a thickness of 20 nm. A doping amount of Si impurities of the n-type GaN layer 5 is, for example, about $4 \times 10^{18}$ cm$^{-3}$. The non-doped AlGaN layer 5 is used as a spacer layer for separating the n-type AlGaN layer 6 from the active layer 4. The n-type AlGaN layer 6 is used as an electron supply layer for supplying electrons as carriers to the active layer. By stopping the supply of TMA, an n-type GaN layer 7 having a thickness of 7 nm is grown as a protective layer on the n-type AlGaN layer 6. A doping amount of Si is, for example, about $5 \times 10^{18}$ cm$^{-3}$. The n-type AlGaN layer 6 is covered with the n-type GaN layer 7 having a lower resistivity. If the GaN layer 4 becomes n-type caused by Si impurities or the like left when the mask pattern was formed, Cp2Mg is introduced properly to realize high resistance.

The substrate is taken out of the MOCVD system, and a silicon nitride (SiN) film 8 is deposited by plasma CVD. Openings for source/drain electrode contact regions are formed through the SiN film, and a source electrode S and a drain electrode D are formed being made of a laminated layer of a Ta layer 11a and an Al layer 11b. An opening for Schottky gate electrode region is formed through the SiN film 7 at an intermediate position between the source/drain electrodes, and a Schottky gate electrode G is formed being made of a laminated layer of an Ni layer 12a and an Au layer 12b. These electrodes can be formed, for example, by a lift-off method. An isolation region extends from the device surface, through the n-type GaN layer 7, n-type AlGaN layer 6 and non-doped AlGaN layer 5 and into the non-doped GaN layer 4. This isolation region can be formed, for example, by etching a recess having a depth of about 100 nm.

According to the embodiment, since the substrate 1 is made of polycrystalline SiC, the cost of the substrate is inexpensive. Even if the polycrystalline substrate is used, an AlN/GaN/AlGaN/GaN semiconductor lamination layer having aligned crystalline orientation can be grown by using the mask pattern 2. By growing the high resistance AlN buffer layer, parasitic capacitance can be reduced. It is therefore possible to form a high speed GaN-HEMT device having a high thermal conductivity and high performance.

Although the parallel stripe-shaped mask pattern is used in the above-description, a mask pattern having hexagonal openings may be used instead of the parallel stripes. Although dislocation occurs along the plane normal direction on the SiC substrate 1, HEMT is not sensitive to dislocation so that high performance GaN-HEMT can be manufactured.

Figure 6:
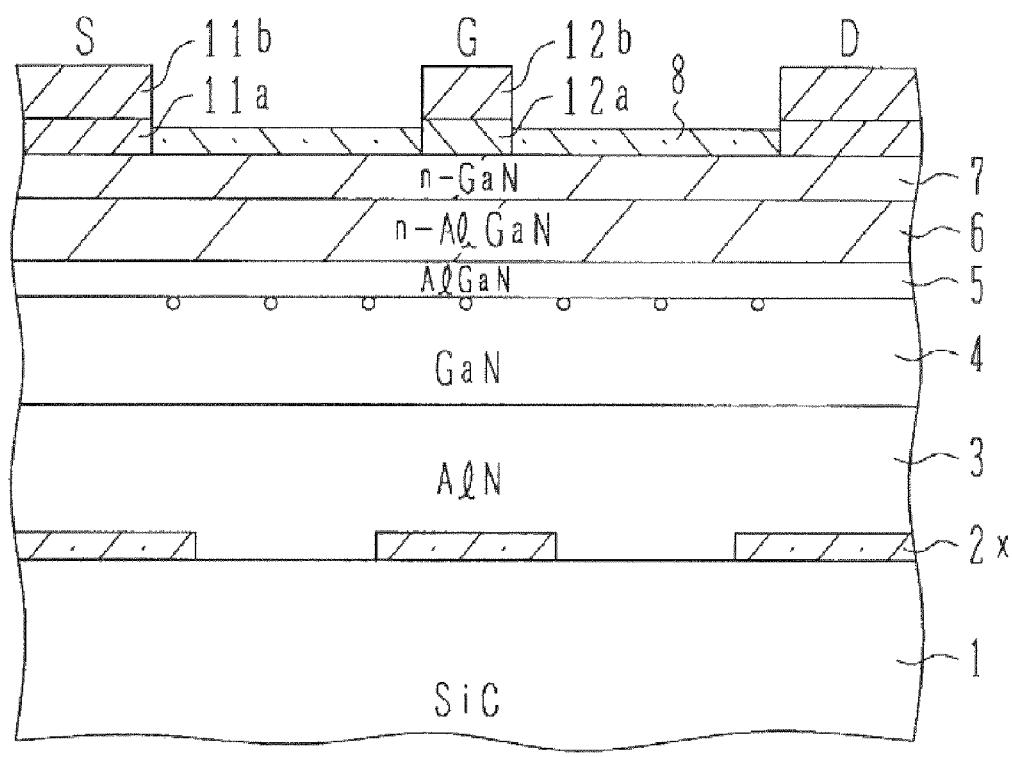
FIG. 6 is a schematic cross sectional view of a GaN-HEMT according to a modification of the first embodiment.

FIG. 6 is a schematic cross sectional view showing the structure of a GaN-HEMT according to a modification of the first embodiment. In this modification, a silicon oxide film having a thickness of 300 nm is deposited on a polycrystalline SiC substrate, for example, by plasma CVD, and wet-etched with dilute hydrofluoric acid by using a resist mask to form a mask pattern 2x of the silicon oxide film. Dry etching may be used instead of wet etching. Other points are similar to the first embodiment. Even if the mask pattern is made of silicon oxide, AlN grows preferentially on the surface of the SiC substrate and does not grow on the silicon oxide surface. Therefore, the side wall of the mask pattern 2x guides the hexagonal pillar sidewall of the AlN growth layer and an AlN layer with aligned a-axes, as well as c-axes, can be grown.

FIGS. 7A to 7D are schematic cross sectional views showing the structure of GaN-HEMT according to the second embodiment.

Figure 7A:
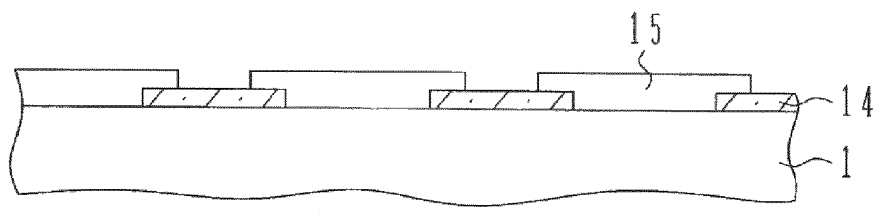
FIGS. 7A to 7D are schematic cross sectional views illustrating processes for manufacturing a GaN-HEMT of the second embodiment.

As shown in FIG. 7A, a silicon oxide film having a thickness of about 300 nm is deposited on the surface of a polycrystalline SiC substrate 1, and etched by using a resist pattern to form a preliminary mask pattern 14 made of the silicon oxide film and having, for example, stripe shape. An AlN layer 15 is grown to a thickness of, e.g., 500 nm on the SiC substrate having the preliminary mask pattern 14 of silicon oxide. The grown AlN layer 15 has a shape covering the upper peripheral surfaces of the preliminary mask pattern having a thickness of 300 nm, and leaving the upper central surface of the preliminary mask pattern un-covered with the AlN layer.

Figure 7B:
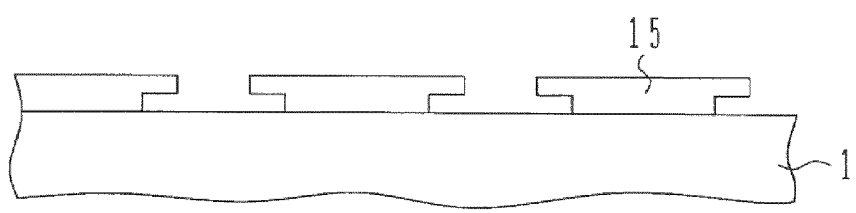
Figure 7C:
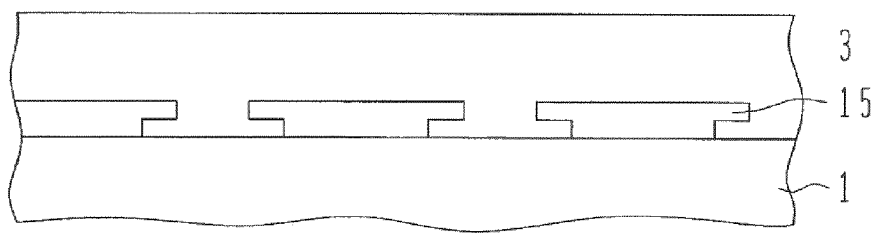

As shown in FIG. 7B, the substrate with the grown AlN layer 15 is taken out of the manufacture system, and the silicon oxide mask pattern 14 is etched and removed, for example, with dilute hydrofluoric acid. In this case, a surface oxide film is also formed on the surface of the AlN layer 15. The AlN layer 15 with the surface oxide film is a new mask pattern having overhangs and a T-shaped cross section.

The substrate is transported into a hydride VPE system to grow an AlN layer 3 having a thickness of 3 μm on the SiC substrate 1. The already formed AlN layer 15 with the surface oxide film functions as a mask pattern. During growth of the AlN layer 3 from the SiC substrate surface, a width of the Al layer is once limited by the mask pattern 15, and thereafter, the AlN layer grows also on the whole surfaces of the mask pattern by lateral growth.

Figure 7D:
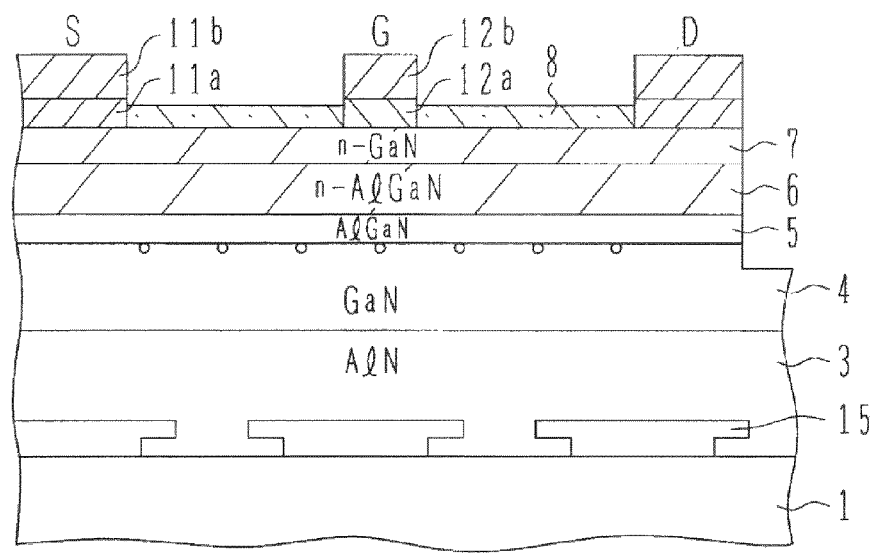

As shown in FIG. 7D, after the AlN buffer layer 3 is grown by hydride VPE, the substrate is transported into an MOCVD system similar to the first embodiment. Grown in this system are a non-doped GaN active layer 4, a non-doped AlGaN spacer layer 5, an Si-doped n-type AlGaN layer 6 and an Si-doped n-type GaN layer 7. A silicon nitride layer 8 is formed, and a source electrode S, a drain electrode D and a gate electrode G are formed to form a GaN-HEMT device.

According to this embodiment, since the mask pattern 15 having a T-shaped cross section is formed overhanging the preliminary mask pattern 14, it becomes easy to narrow an opening between mask patterns 15. Since dislocations formed from the SiC substrate surface along the substrate normal direction are limited by the narrow opening, it is possible to form a quasi single crystal region with less dislocations over a wide area. Higher performance GaN-HEMT can therefore be manufactured.

Figure 8A:
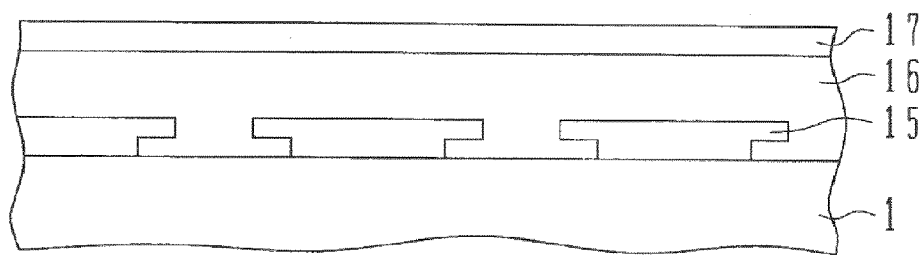
FIGS. 8A to 8C are cross sectional views showing modifications of the second embodiment.
Figure 8B:
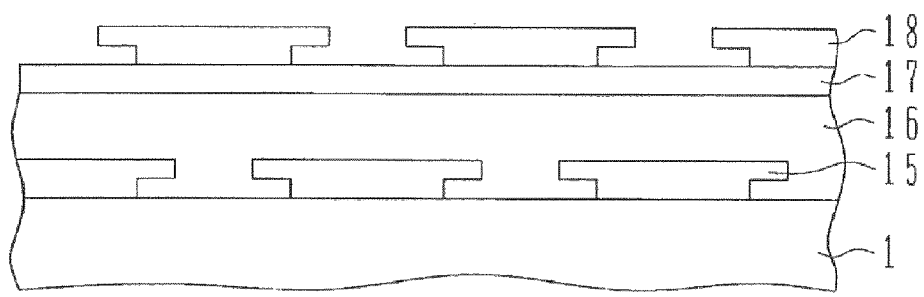
Figure 8C:
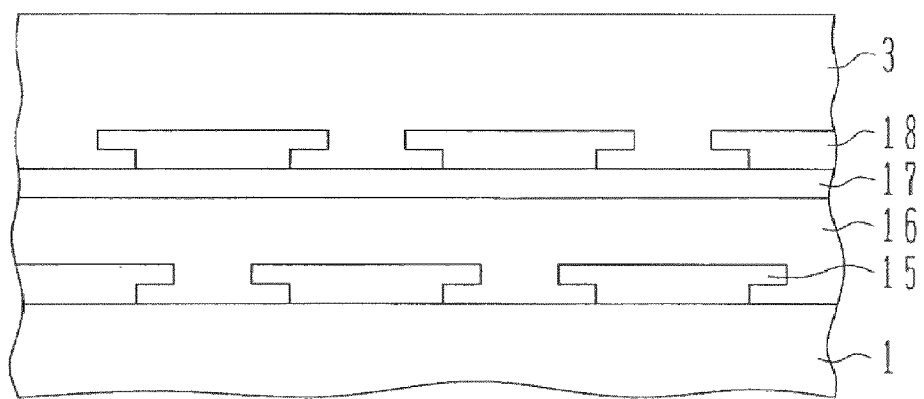

FIGS. 8A, 8B and 8C are cross sectional views showing a modification of the second embodiment.

FIG. 8A shows the state that after a first AlN mask pattern 15 is formed, a first AlN buffer layer 16 and a GaN buffer layer 17 covering the first AlN mask pattern 15 are grown by hydride VPE, in accordance with the processes shown in FIGS. 7A and 7B.

As shown in FIG. 8B, a second AlN mask pattern 18 is formed on the GaN buffer layer 17 by the processes similar to the processes shown in FIGS. 7A and 7B. The second AlN mask pattern is disposed in such a manner that the second AlN mask pattern covers the opening of the first AlN mask pattern.

As shown in FIG. 8C, a second AlN buffer layer 3 covering the second AlN mask pattern is grown by hydride VPE. In this manner, a wafer with the AlN buffer layer 3 is formed. Thereafter, a GaN-HEMT structure similar to the second embodiment is formed on the AlN buffer layer 3.

According to this modification, the whole surface of the SiC substrate is covered with the AlN mask patterns 15 and 18 as viewed from the upper side. Dislocations extending from the surface of the SiC substrate along the substrate normal direction are therefore intercepted by any one of the mask patterns 15 and 18. It is possible to manufacture a GaN series compound semiconductor device having excellent characteristics on the AlN buffer layer 3 with less dislocations.

Figure 9:
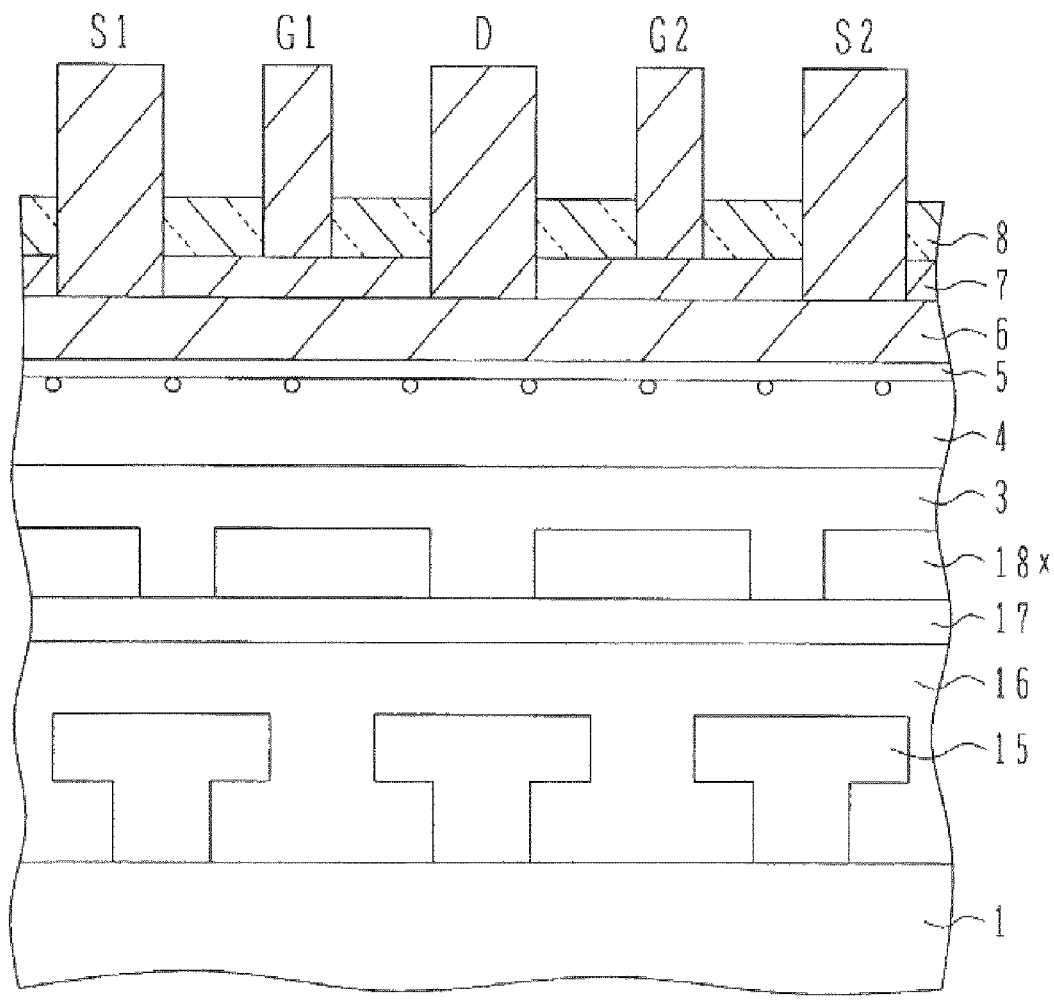
FIG. 9 is a cross sectional view showing still another modification.
Figure 10A:
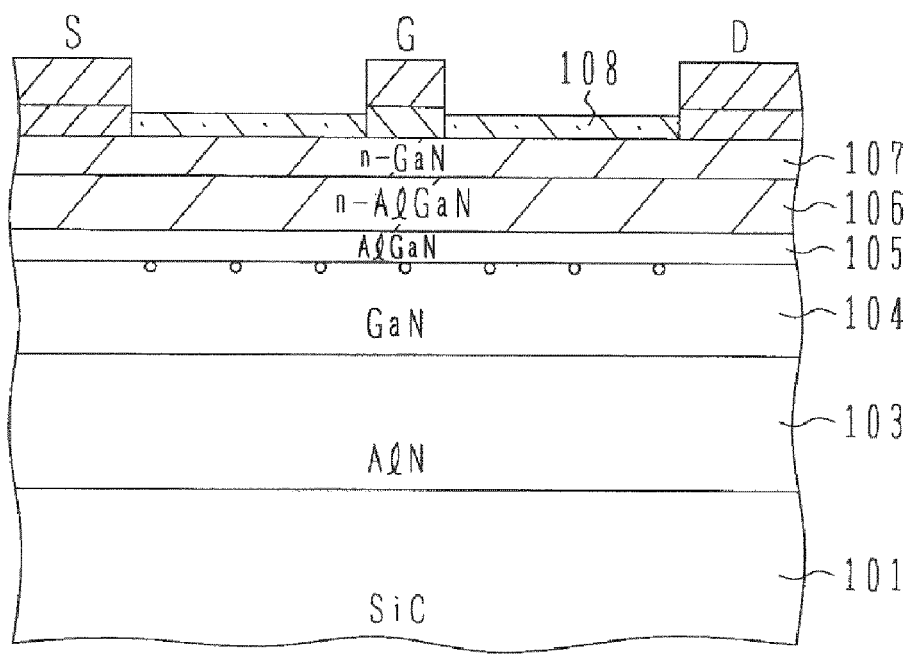
FIGS. 10A and 10B are cross sectional views explaining conventional techniques.
Figure 10B:
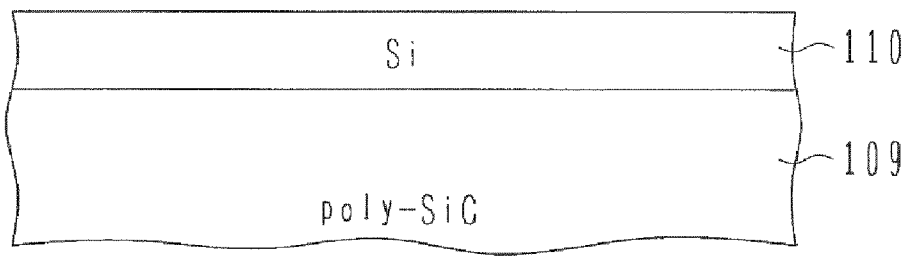

FIG. 9 shows another modification. A second AlN mask pattern 18x has a rectangular cross section, and covers the opening of the first mask pattern 15, hence, together with the first mask pattern 15 having a T-shape cross section, covering the whole surface of the substrate as viewed in plan. Other points in the structure up to an AlN buffer layer 3 are similar to those shown in FIGS. 8A to 8C. Similar to the first and second embodiments, on the AlN buffer layer 3, a non-doped GaN electron transfer layer 4, a non-doped AlN spacer layer 5 and an Si-doped n-type AlN electron supply layer 6 are grown, an Si-doped n-type GaN protective layer 7 is further grown, and a silicon nitride film 8 is deposited on the protective layer 7 by CVD. Openings for source/drain regions are formed through the silicon nitride film 8, and the n-type GaN layer 7 is etched to expose the surface of the n-type AlN electron supply layer 6. Source electrodes are provided on both sides of a drain electrode. A drain electrode D in ohmic contact with the n-type AlN layer 6 is formed, and source electrodes S1 and S2 in ohmic contact with the n-type AlN layer are formed on both sides of the drain electrode. Openings for gate contact regions are formed through the silicon nitride film 8 between the drain electrode D and source electrodes S1 and S2, and gate electrodes G1 and G2 in Schottky contact with the n-type GaN layer 7 are formed.

A cubic crystalline [111] oriented SiC polycrystalline substrate has a property similar to that of a hexagonal crystalline [0001] oriented SiC polycrystalline substrate. It is expected that a cubic crystalline [111] oriented SiC polycrystalline substrate may be used in place of a hexagonal crystalline [0001] oriented SiC polycrystalline substrate. It is expected that GaN series compound semiconductor of $Al_xIn_yGa_{1-x-y}N$ ($0 \leq x \leq 1.0$, $0 \leq y \leq 1.0$) including AlN, GaN and AlGaN can be grown on a polycrystalline substrate. Although manufacture of GaN-HEMT has been described, products of a GaN series compound semiconductor wafer may be provided such as a wafer grown with an AlN buffer layer and a wafer grown with a lamination of a GaN layer/a non-doped AlGaN layer/an n-type AlGaN layer/an n-type GaN layer, or part thereof, on an AlN buffer layer. An electronic device to be manufactured is not limited to HEMT. Other electronic devices and optical devices may also be manufactured. As the mask material, other insulators such as silicon nitride and silicon oxynitride may also be used in place of silicon oxide, and other Al-containing nitride semiconductors such as AlGaN may also be used in place of AlN.

The present invention has been described in connection with the preferred embodiments. The invention is not limited only to the above embodiments. It will be apparent to those skilled in the art that other various modifications, improvements, combinations, and the like can be made.

I claim:

1. A compound semiconductor wafer comprising:
a polycrystalline SiC substrate having an orientation along [0001] direction;
a mask pattern formed on said polycrystalline SiC substrate, said mask pattern having an opening of a stripe shape defined by opposing parallel sides or a polygonal shape using at least part of six sides of a hexagon and exposing a surface of said polycrystalline SiC substrate in said opening; and
a nitride semiconductor buffer layer contacting said polycrystalline SiC substrate in said opening of said mask pattern, burying said mask pattern, and having a flat surface.

2. The compound semiconductor wafer according to claim 1, wherein said opening of said mask pattern is a hexagon having an apex angle of 120 degrees.

3. The compound semiconductor wafer according to claim 1, wherein said nitride semiconductor buffer layer is an AlN layer containing Cl.

4. The compound semiconductor wafer according to claim 1, wherein said mask pattern is made of AlN or insulator having an oxide film on a surface thereof.

5. The compound semiconductor wafer according to claim 1, wherein said mask pattern is made of AlN having an oxide film on a surface thereof and includes a base portion contacting said polycrystalline SiC substrate and an overhang portion disposed on said base portion and extending from said base portion toward a side of said opening.

6. The compound semiconductor wafer according to claim 1, further comprising a GaN series compound semiconductor layer formed on said nitride semiconductor buffer layer.

7. The compound semiconductor wafer according to claim 6, wherein said GaN series compound semiconductor layer includes a lamination of a GaN layer and an AlGaN layer.

8. The compound semiconductor wafer according to claim 7, wherein said AlGaN layer includes a lamination of a non-doped AlGaN layer and an n-type AlGaN layer.

9. The compound semiconductor wafer according to claim 1, wherein said nitride semiconductor buffer layer is in direct contact with said polycrystalline SiC substrate in said opening of said mask pattern.

10. A method for manufacturing a semiconductor wafer, comprising:
forming a mask pattern on a polycrystalline SiC substrate having an orientation along [0001] direction, said mask pattern having an opening of a stripe shape defined by opposing parallel sides or a polygonal shape using at least part of six sides of a hexagon and exposing a surface of said polycrystalline SiC substrate in said opening; and
growing a nitride semiconductor buffer layer starting growing on said polycrystalline SiC substrate exposed in said opening of said mask pattern, burying said mask pattern, and having a flat surface.

11. The method for manufacturing a compound semiconductor wafer according to claim 10, wherein said opening of said mask pattern is a hexagon having an apex angle of 120 degrees.

12. The method for manufacturing a compound semiconductor wafer according to claim 10, wherein said mask pattern is made of AlN or insulator having an oxide film on a surface thereof.

13. The method for manufacturing a compound semiconductor wafer according to claim 10, wherein said forming said mask pattern comprises:
forming an insulating preliminary mask layer on said polycrystalline SiC substrate;
forming a preliminary mask pattern by etching said preliminary mask layer to form an opening through said preliminary mask layer, said opening having a stripe shape defined by opposing parallel sides or a polygonal shape using at least part of six sides of a hexagon and exposing a surface of said polycrystalline SiC substrate;
growing an AlN mask pattern starting growing on said polycrystalline SiC substrate exposed in said opening of said preliminary mask pattern, overriding an upper surface of said preliminary mask pattern to cover a peripheral area of the upper surface of said preliminary mask pattern and leaving a central area thereof; and
removing said preliminary mask pattern and at the same time oxidizing a surface of said AlN mask pattern.

14. The method for manufacturing a compound semiconductor wafer according to claim 13, wherein said opening of said mask pattern is a hexagon having an apex angle of 120 degrees.

15. The method for manufacturing a compound semiconductor wafer according to claim 10, wherein said growing said nitride semiconductor buffer layer grows said nitride semiconductor buffer layer by hydride vapor phase epitaxy using chloride of a group III element as a group III element source.

16. The method for manufacturing a compound semiconductor wafer according to claim 10, wherein said nitride semiconductor buffer layer is an AlN layer.

17. The method for manufacturing a compound semiconductor wafer according to claim 10, further comprising after said growing said nitride semiconductor buffer layer:
   growing a GaN series compound semiconductor layer on said nitride semiconductor buffer layer.

18. The method for manufacturing a compound semiconductor wafer according to claim 17, wherein said growing said GaN series compound semiconductor layer is performed by a metal organic chemical vapor deposition method.

19. The method for manufacturing a compound semiconductor wafer according to claim 17, wherein said growing said GaN series compound semiconductor layer comprises:
   growing a GaN layer; and
   growing an AlGaN layer.

20. The method for manufacturing a compound semiconductor wafer according to claim 10, wherein said step (b) grows said nitride semiconductor buffer layer in direct contact with said polycrystalline SiC substrate exposed in said opening of said mask pattern.

21. A compound semiconductor device comprising:
   a polycrystalline SiC substrate having an orientation along [0001] direction;
   a mask pattern formed on said polycrystalline SiC substrate, said mask pattern having an opening of a stripe shape defined by opposing parallel sides or a polygonal shape using at least part of six sides of a hexagon and exposing a surface of said polycrystalline SiC substrate in said opening;
   a nitride semiconductor buffer layer contacting said polycrystalline SiC substrate in said opening of said mask pattern, burying said mask pattern, and having a flat surface; and
   a GaN series compound semiconductor layer formed on said nitride semiconductor buffer layer.

22. The compound semiconductor device according to claim 21, wherein said nitride semiconductor buffer layer is in direct contact with said polycrystalline SiC substrate in said opening of said mask pattern.

23. A method for manufacturing a semiconductor device, comprising:
   forming a mask pattern on a polycrystalline SiC substrate having an orientation along [0001] direction, said mask pattern having an opening of a stripe shape defined by opposing parallel sides or a polygonal shape using at least part of six sides of a hexagon and exposing a surface of said polycrystalline SiC substrate in said opening;
   growing a nitride semiconductor buffer layer starting growing on said polycrystalline SiC substrate exposed in said opening of said mask pattern, burying said mask pattern, and having a flat surface; and
   growing a GaN series compound semiconductor layer on said nitride semiconductor buffer layer.

24. The method for manufacturing a semiconductor device according to claim 12, wherein said step (b) grows said nitride semiconductor buffer layer in direct contact with said polycrystalline SiC substrate exposed in said opening of said mask pattern.

* * * * *